United States Patent
Kyuho

(10) Patent No.: US 9,153,459 B2
(45) Date of Patent: Oct. 6, 2015

(54) MANUFACTURING METHOD OF SEMICONDUCTOR DEVICE AND ADJUSTING APPARATUS

(75) Inventor: Takashi Kyuho, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 807 days.

(21) Appl. No.: 13/352,611

(22) Filed: Jan. 18, 2012

(65) Prior Publication Data

US 2012/0244646 A1 Sep. 27, 2012

(30) Foreign Application Priority Data

Mar. 24, 2011 (JP) ................................ 2011-066694
Oct. 24, 2011 (JP) ................................ 2011-233316

(51) Int. Cl.
*H01L 21/66* (2006.01)
*H01L 21/3215* (2006.01)

(52) U.S. Cl.
CPC ........... *H01L 21/32155* (2013.01); *H01L 22/12* (2013.01); *H01L 22/20* (2013.01)

(58) Field of Classification Search
None
See application file for complete search history.

(56) References Cited

U.S. PATENT DOCUMENTS 5,882,994 A * 3/1999 Araki et al. ................... 438/593

FOREIGN PATENT DOCUMENTS

| JP | 2000-100973 | 4/2000 |
|---|---|---|
| JP | 2004-503940 | 2/2004 |
| JP | 2006-202821 | 8/2006 |
| JP | 2007-538383 | 12/2007 |
| WO | WO 01/97279 A2 | 12/2001 |
| WO | WO 2004/036639 A1 | 4/2004 |
| WO | WO 2005/045875 A1 | 5/2005 |

OTHER PUBLICATIONS

Takashi Kyuho et al., "Device-level APC in Ion Implantation for Analog Device", ISSM 2006, The 15th International Symposium on Semiconductor Manufacturing, PC-209, Sep. 2006, 4 Pages.

* cited by examiner

*Primary Examiner* — Jack Chen
(74) *Attorney, Agent, or Firm* — Oblon, McClelland, Maier & Neustadt, L.L.P.

(57) ABSTRACT

According to embodiments, there is provided a manufacturing method of a semiconductor device includes forming a semiconductor thin film on a substrate; processing the thin film to a predetermined shape; executing an ion implantation process on the thin film processed to the predetermined shape; executing an anneal treatment on the thin film on which the ion implantation process has been executed to create a resistor element; and adjusting both or any one of a process condition of the ion implantation process and a treatment condition of the anneal treatment based on at least any one of a film forming condition and a film formation result of the forming and a film process result of the processing.

4 Claims, 12 Drawing Sheets

FIG.5A
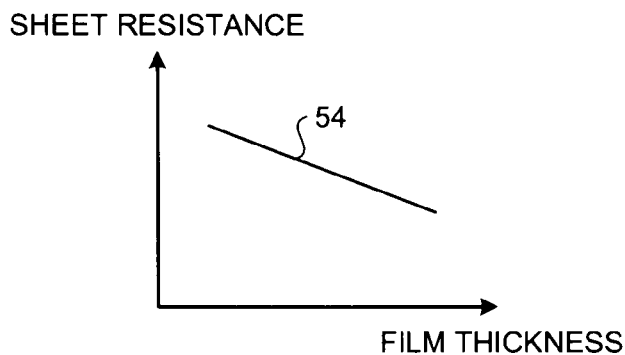
FIG.5B
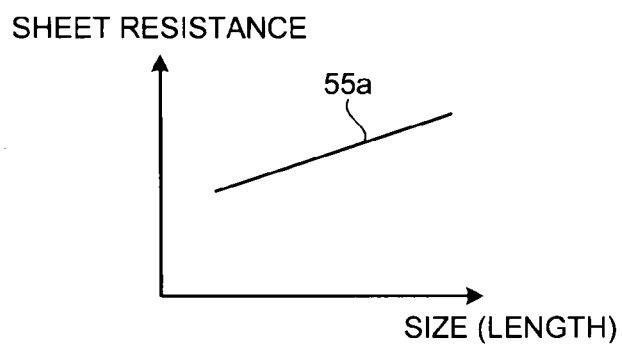
FIG.5C
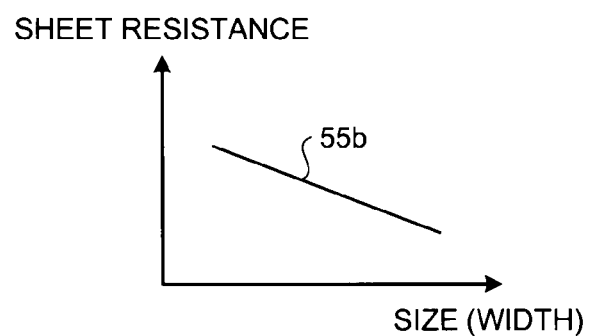
FIG.6
| IN-FURNACE POSITION | B | C | D | E |
|---|---|---|---|---|
| IN-FURNACE POSITION COEFFICIENT | α | β | γ | δ |
| ($\alpha < \beta < \gamma < \delta$) | | | | |

FIG.14

| IN-APPARATUS POSITION | PROCESS TEMPERATURE | PRESSURE IN PROCESS | GAS FLOW RATE | PROCESS TIME |
|---|---|---|---|---|
| 1 | s (DEGREE) | t (ATMOSPHERE) | u (m$^3$/MINUTE) | v (MINUTE) |
| | | | | |

FIG.15

| PROCESS TIME | NUMBER OF PROCESS TIMES | PROCESS TEMPERATURE |
|---|---|---|
| w (MINUTE) | x (TIMES) | y (DEGREE) |

MANUFACTURING METHOD OF SEMICONDUCTOR DEVICE AND ADJUSTING APPARATUS

CROSS-REFERENCE TO RELATED APPLICATIONS

This application is based upon and claims the benefit of priority of Japanese Patent Application No. 2011-066694, filed on Mar. 24, 2011, and Japanese Patent Application No. 2011-233316, filed on Oct. 24, 2011, the entire contents of all of which are incorporated herein by reference.

FIELD

Embodiments described herein relate generally to a manufacturing method of semiconductor device and an adjusting apparatus.

BACKGROUND

Conventionally, there is known a manufacturing method of semiconductor device for manufacturing the semiconductor device by repeating a step of forming a thin film of semiconductor on a substrate and a step of processing the formed thin film. In the manufacturing method of the semiconductor device, a film forming accuracy and a processing accuracy when a thin film was formed and processed next time were improved by measuring the shape and the characteristics of a thin film each time respective steps were finished and feedback controlling the process conditions in the respective steps based on the result of measurement.

However, when the process conditions in the respective steps are feedback controlled, since the effect resulting from the feedback control is reflected to thin films formed and processed next time and thereafter, a problem arises in that the yield of a product formed and processed this time is lowered.

BRIEF DESCRIPTION OF THE DRAWINGS

FIG. 5A is an explanatory view illustrating an example of film thickness function information according to the first embodiment;

FIG. 5B and FIG. 5C are explanatory views illustrating examples of size function information according to the first embodiment;

FIG. 6 is a view illustrating an example of in-furnace coefficient information according to the first embodiment;

FIG. 14 is an explanatory view illustrating an example of film forming conditions information according to the second embodiment;

FIG. 15 is an explanatory view illustrating an example of etching conditions information according to the second embodiment.

DETAILED DESCRIPTION

According to the embodiments a manufacturing method of a semiconductor device includes forming a semiconductor thin film on a substrate; processing the thin film to a predetermined shape; executing an ion implantation process on the thin film processed to the predetermined shape; executing an anneal treatment on the thin film on which the ion implantation process has been executed to create a resistor element; and adjusting both or any one of a process condition of the ion implantation process and a treatment condition of the anneal treatment based on at least any one of a film forming condition and a film formation result of the forming and a film process result of the processing.

Manufacturing methods of a semiconductor device, manufacturing systems of a semiconductor device, and adjusting apparatuses according to a first embodiment and a second embodiment will be explained in detail below with reference to the accompanying drawings. Note that the present invention is not limited to the following embodiments. Further, hereinafter, the manufacturing method of the semiconductor device is simply described as "manufacturing method" and the manufacturing system of the semiconductor device is simply described as "manufacturing system".

First Embodiment

Figure 1:
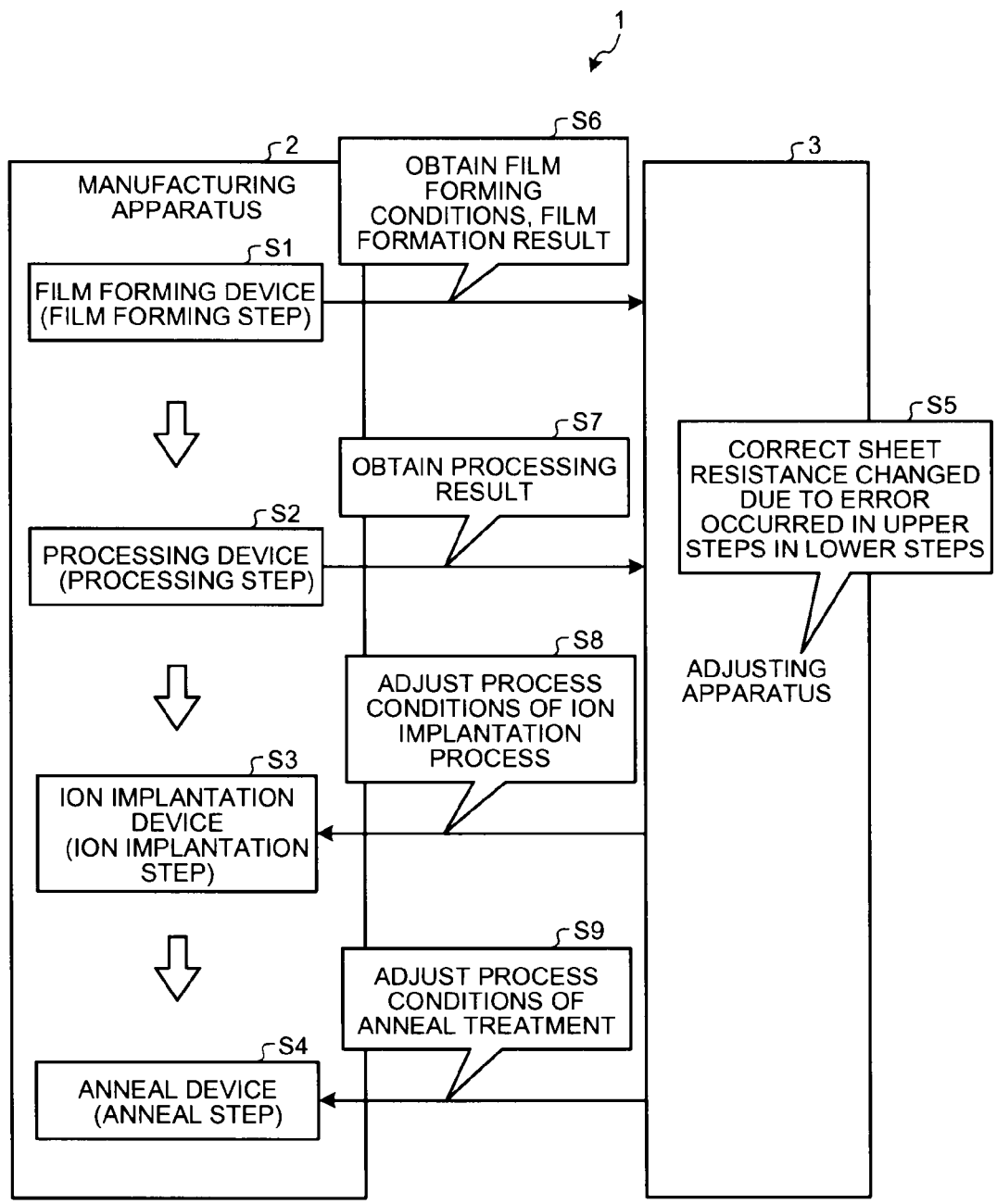
FIG. 1 is an explanatory view illustrating a manufacturing method by a manufacturing system according to a first embodiment.

First, a manufacturing method by a manufacturing system according to a first embodiment will be explained using FIG. 1. FIG. 1 is an explanatory view illustrating the manufacturing method by the manufacturing system 1 according to the first embodiment. Note that FIG. 1 illustrates a configuration of a manufacturing system 1 in a simplified mode. Further, the manufacturing system 1 will be described later in detail using FIG. 2.

Further, hereinafter, a case that a thin film resistor element (hereinafter, described as "resistor element") of semiconductor such as polysilicon and the like is created will be explained. Further, the manufacturing system 1 can also create a passive device such as a capacitor and the like and an active device such as a transistor and the like in addition to the resistor element.

Further, hereinafter, from a viewpoint of simplifying explanation, when a film forming device, a processing device, an ion implantation device, and an anneal device included in the manufacturing system according to the first embodiment are collectively called a manufacturing apparatus.

As illustrated in FIG. 1, the manufacturing system 1 includes the manufacturing apparatus 2 for manufacturing a semiconductor device and an adjusting apparatus 3 for adjusting the operations of the plural devices included in the manufacturing apparatus 2. Then, in the manufacturing system 1, when the resistor element of polysilicon is created, first, the film forming device executes the film forming step for forming a thin film of polysilicon on a substrate such as a silicon wafer and the like (step S1).

Subsequently, in the manufacturing apparatus 2, the processing device executes the processing step for processing the formed thin film to a predetermined shape (step S2). The processing device processes the thin film to the shape of the resistor element by the processing step. Subsequently, in the manufacturing apparatus 2, the ion implantation device executes the ion implantation step for executing an ion implanting process of impurity ions to the thin film processed to the shape of the resistor element (step S3).

Subsequently, in the manufacturing apparatus 2, the anneal device executes the anneal step for applying an anneal treatment to the thin film to which the impurity ions have been implanted (step S4). The anneal device creates the resistor element by activating the impurity ions in the thin film by the anneal step. Note that the resistor element is disposed with an electrode of a resistor element by subsequent steps.

Incidentally, in the manufacturing apparatus 2, it is important how the sheet resistance of the resistor element as a final product is approached to a desired resistance value. Here, the sheet resistance of the resistor element created by the manufacturing apparatus 2 depends on the film thickness, the size, the impurity ions concentration, and the impurity ions activation rate of the resistor element.

Thus, in the manufacturing system 1, when an error occurs in the film thickness and the size of the thin film in upstream steps such as the film forming step and the processing step, the adjusting apparatus 3 corrects a final sheet resistance which is changed by the error occurred in the upstream steps in downstream steps such as the ion implantation step and the anneal step (step S5).

Specifically, when the thin film has been formed by the film forming device, the adjusting apparatus 3 obtains the film forming conditions applied when the thin film was formed and the film formation result of the thin film from the film forming device (step S6). For example, the adjusting apparatus 3 obtains the temperature in a film forming furnace at the time of film formation as the film forming conditions and obtains the film thickness of the formed thin film as the film formation result.

Further, when the shape of the thin film is processed by the processing device, the adjusting apparatus 3 obtains the processing result of the thin film from the processing device (step S7). For example, the adjusting apparatus 3 obtains the size of the thin film processed to the shape of the resistor element as the processing result.

The size here is the length and the width on the substrate of the thin film processed to the shape of the resistor element. Note that the length here is a length on the substrate in a direction where a current flows when the thin film is functioned as the resistor element, and the width is a length on the substrate in a direction orthogonal to the direction where the current flows.

Subsequently, the adjusting apparatus 3 corrects the sheet resistance of the resistor element by adjusting the process conditions of the ion implantation process based on at least any one of the film forming conditions, the film formation result, and the processing result which have been obtained (step S8).

For example, the adjusting apparatus 3 predicts the sheet resistance of the resistor element based on at least any one of the film forming conditions, the film formation result, and the processing result which have been obtained. Then, the adjusting apparatus 3 adjusts the process time of the ion implantation process and the dose amount of the impurity ions so as to reduce the difference between the predicted sheet resistance and a predetermined desired resistance value. Note that the detail of the adjustment will be described later using FIG. 8A.

Subsequently, the adjusting apparatus 3 corrects the sheet resistance of the resistor element by adjusting the treatment conditions of the anneal treatment based on at least any one of the film forming conditions, the film formation result, and the processing result which have been obtained (step S9).

For example, the adjusting apparatus 3 adjusts the treatment time and the treatment temperature of the anneal treatment so as to reduce the difference between the sheet resistance predicted based on at least any one of the film forming conditions, the film formation result, and the processing result which has been obtained and the predetermined desired resistance value. Note that the detail of the adjustment will be described later using FIG. 8B.

As described above, the adjusting apparatus 3 corrects the offset of the sheet resistance, which is changed by the error occurred in the upstream steps, from an object value in the downstream steps. With the operation, in the manufacturing system 1, since the sheet resistance of the resistor element as the final product can be approached to the predetermined resistance value, the dispersion of the sheet resistance can be suppressed. Thus, according to the manufacturing system 1, the yield of a product can be improved.

Note that, here, the case that the adjusting apparatus 3 adjusts both the process conditions of the ion implantation process and the treatment conditions of the anneal treatment, the adjusting apparatus 3 can also adjust any one of the process conditions of the ion implantation process and the treatment conditions of the anneal treatment. Note that the point will be described later using FIG. 11 and FIG. 12.

Figure 2:
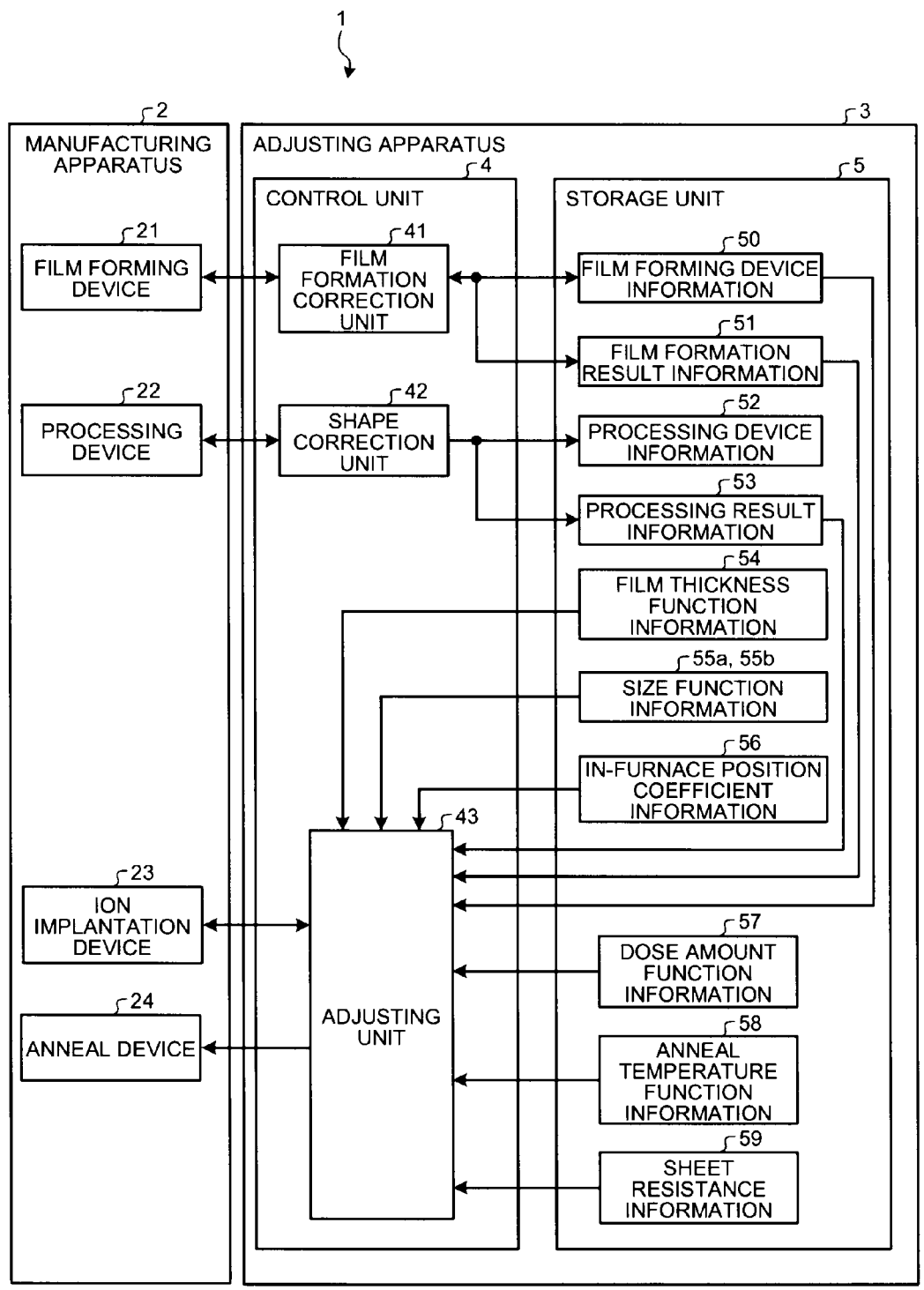
FIG. 2 is an explanatory view illustrating a configuration of the manufacturing system according to the first embodiment.

Next, a configuration of the manufacturing system 1 according to the first embodiment will be explained using FIG. 2. FIG. 2 is an explanatory view illustrating the configuration of the manufacturing system 1 according to the first embodiment. As illustrated in FIG. 2, the manufacturing system 1 includes the manufacturing apparatus 2 and the adjusting apparatus 3. The manufacturing apparatus 2 includes the film forming device 21, the processing device 22, the ion implantation device 23, and the anneal device 24.

Figure 3:
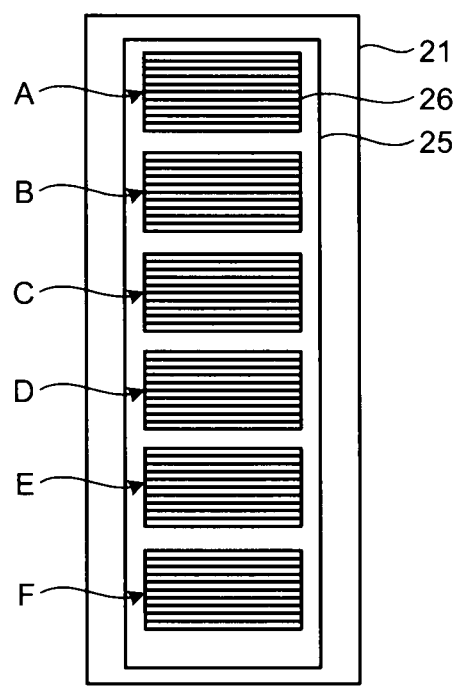
FIG. 3 is a schematic view illustrating a film forming device according to the first embodiment.

The film forming device 21 is a device for forming a thin film of semiconductor on a substrate such as a silicon wafer and the like by executing a LP-CVD (Low Pressure-Chemical Vapor Deposition). Here, the film forming device 21 will be explained using FIG. 3. FIG. 3 is a schematic view illustrating the film forming device 21 according to the first embodiment.

As illustrated in FIG. 3, the film forming device 21 includes the film forming furnace 25 for accommodating and processing plural substrates 26. Further, the film forming furnace 25 accommodates the plural substrates 26 which are targets to be processed in multi-stages in a longitudinal direction.

Further, the film forming device 21 is set with plural types of the film forming conditions which are predetermined in response to the film thickness of a thin film to be formed. For example, the film forming device 21 is set with the film forming conditions such as a temperature in the film forming furnace 25 at the time of film formation, a film forming time, a flow rate of a material gas introduced into the film forming furnace 25, a pressure in the film forming furnace 25, and the like.

Then, the film forming device 21 forms a thin film of semiconductor (here, polysilicon) on the substrate 26 by executing the LP-CVD in the film forming furnace 25 based on the set plural types of the film forming conditions.

In the vertical type film forming device 21, a difference is made in the film quality of the film to be formed depending on a position of the substrate 26 in the film forming furnace 25 (hereinafter, described as "in-furnace position"). For example, in the case of the vertical type film forming furnace 25 as illustrated in FIG. 3, when thin films of polysilicon are formed on the plural substrates 26 accommodated in the multi-stage in an up/down direction, the grain size of the polysilicon tends to become larger as the positions of the substrates 26 to which the thin films are formed are located in upper stages in the film forming furnace 25.

Then, when the ion implantation process and the anneal treatment are executed to polysilicon films having a different grain size in the same process conditions, the sheet resistance of a polysilicon film having a larger grain size becomes smaller as compared with a polysilicon film having a smaller grain size. That is, when a dispersion occurs in the grain sizes of polysilicon, a dispersion also occurs in the sheet resistances of the resistor elements.

Thus, in the manufacturing system 1, the space in the film forming furnace 25 is divided to plural (here, six) in-furnace positions A, B, C, D, E and, F in a longitudinal direction, and the substrates 26 to which thin films are formed at the in-furnace positions B, C, D and E except the in-furnace position A of an uppermost stage and the in-furnace position F of an lowermost stage are sent to a next step.

Further, when the various types of the film forming conditions are set, the film forming device 21 outputs the set film forming conditions to the adjusting apparatus 3, and when the thin films are completed, the film forming device 21 measures the film thicknesses of the formed thin films and outputs the measurement result to the adjusting apparatus 3 as a film formation result. At the time, the film forming device 21 outputs the in-furnace positions B, C, D, and E of the substrates 26 whose film thicknesses are measured and the film formation result to the adjusting apparatus 3 in correspondence with each other.

Returning to the explanation of FIG. 2, the explanation of the manufacturing apparatus 2 will be continued. The processing device 22 is a device for processing the thin film formed by the film forming device 21 to the predetermined shape. Here, the processing device 22 processes the thin film of polysilicon to the shape of the resistor element based on the set processing conditions.

Specifically, the processing device 22 forms a resist mask by coating a photoresist on the thin film of polysilicon and applying a predetermined patterning to the photoresist by photolithography. Subsequently, the processing device 22 processes the thin film of polysilicon to the shape of the resistor element by executing RIE (Reactive Ion Etching) using the resist mask.

Then, when the various types of the processing conditions are set, the processing device 22 outputs the set processing conditions to the adjusting apparatus 3, and when the shape of the thin film is processed, the processing device 22 measures the size of the processed thin film and outputs the measurement result to the adjusting apparatus 3 as the processing result.

Figure 4:
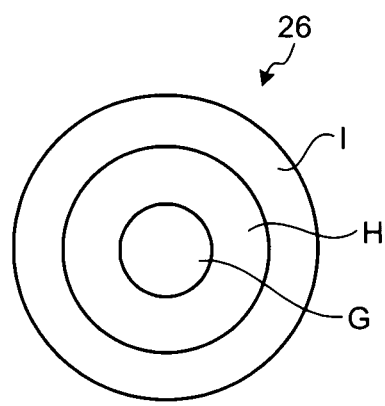
FIG. 4 is a view illustrating a size measuring position by a processing device according to the first embodiment.

Here, a measuring position of the size by the processing device 22 will be explained using FIG. 4. FIG. 4 is a view illustrating the measuring position of the size by the processing device 22 according to the first embodiment. As illustrated in FIG. 4, the processing device 22 divides the respective substrates 26 to plural (here, three) measurement regions G, H, and I.

Then, the processing device 22 measures the sizes of the thin films processed in the shape of the resistor element in the respective measurement regions G, H, and I, that is, measures the lengths and the widths of the thin films on the planes of the substrates 26 and outputs the measurement result of each of the measurement regions G, H, and I to the adjusting apparatus 3.

Returning to the explanation of FIG. 2, the explanation of the manufacturing apparatus 2 will be continued. The ion implantation device 23 is a device for ion implanting impurity ions to the thin films of polysilicon formed in the predetermined shape. When the ion implantation process is executed, the ion implantation device 23 outputs the process conditions of the ion implantation process to the adjusting apparatus 3. For example, the ion implantation device 23 outputs the dose amount of the implanted impurity ions, the implantation time of the impurity ions, and the like to the adjusting apparatus 3 as the process conditions.

The anneal device 24 is a device for creating the resistor element by activating the impurity ions in the thin film by executing a heat treatment to the thin film of polysilicon to which the impurity ions are ion implanted.

The adjusting apparatus 3 is an apparatus for adjusting the contents of the manufacturing steps executed by the respective units of the film forming device 21, the processing device 22, the ion implantation device 23, and the anneal device 24 included in the manufacturing apparatus 2 and has a control unit 4 and a storage unit 5.

The storage unit 5 is a storage device for storing film forming device information 50, film formation result information 51, processing device information 52, processing result information 53, film thickness function information 54, size function information 55a and 55b, in-furnace position coefficient information 56, dose amount function information 57, anneal temperature function information 58, and sheet resistance information 59.

The film forming device information 50 is a set history of the various types of the film forming conditions set to the film forming device 21, and, specifically, a set history as to the film forming conditions such as the temperature in the film forming furnace 25 at the time of film formation, the film forming time, the flow rate of the material gas introduced into the film forming furnace 25, the pressure in the film forming furnace 25, and the like. The film formation result information 51 is a measured value when the film thicknesses of the formed thin films are measured by the film forming device 21.

The processing device information 52 is a set history of the various types of the processing conditions set to the processing device 22, and, specifically, a history as to a type of an exposure mask used at the time of photography, position information of the exposure mask at the time of exposure, and the like. The processing result information 53 is a measured value when the sizes of the processed thin films are measured by the processing device 22.

The film thickness function information 54 is a function showing the relation between the film thickness of the thin film formed in the film forming step and the sheet resistance of the thin film when the ion implantation process and the anneal treatment are applied to the thin film formed in the film forming step.

Further, the size function information 55a and 55b is a function showing the relation between the size of the thin film whose shape is processed in the processing step and the sheet resistance of the thin film when the ion implantation and the anneal treatment are applied to the thin film processed in the processing step.

Here, an example of the film thickness function information 54 and the size function information 55a and 55b will be explained using FIG. 5A, FIG. 5B, and FIG. 5C. FIG. 5A is an explanatory view illustrating an example of the film thickness function information 54 according to the first embodiment, and FIG. 5B and FIG. 5C are explanatory views illustrating an example of the size function information 55a and 55b according to the first embodiment.

As illustrated in FIG. 5A, the film thickness function information 54 is a function showing the relation between the sheet resistance shown by the following expression and the film thickness of the thin film.

$$\text{sheet resistance} = -a(\text{film thickness of resistor element}) + b \quad \text{Expression (1)}.$$

Note that a and b in the expression (1) are positive constants calculated from the size of the thin film and the process conditions of the ion implantation process and the anneal treatment. As illustrated in the drawing, a larger film thickness of the thin film more reduces the resistance value of the sheet resistance.

Note that although FIG. 5A exemplifies a function as the film thickness function information 54, the storage unit 5 stores plural functions to each film thickness of the thin film and to each combination of the process conditions of the ion implantation process and the anneal treatment. The film thickness function information 54 is used when the control unit 4 predicts the sheet resistance based on the film forming device information 50 and the film formation result information 51.

Further, as illustrated in FIG. 5B, the size function information 55a is a function showing the relation between the sheet resistance shown by the following expression and the size (length) of the sheet resistance.

$$\text{sheet resistance} = c \times (\text{size of resistor element}) + d \quad \text{Expression (2)}$$

Note that c and d in the expression (2) are positive constants calculated from the size of the thin film and the process conditions of the ion implantation process and the anneal treatment. As illustrated in the drawing, a larger length of the thin film more increases the resistance value of the sheet resistance.

Further, as illustrated in FIG. 5C, the size function information 55b is a function showing the relation between the sheet resistance and the size (width) of the sheet resistance. The size function information 55b as to the width of the sheet resistance is shown by a primary function likewise the expression (2).

However, in the case of the size function information 55b as to the width of the sheet resistance, the constant c in the expression (2) becomes a negative constant. That is, a larger width of the thin film more reduces the resistance value of the sheet resistance.

Note that although FIG. 5B and FIG. 5C exemplify a function, respectively as the size function information 55a and 55b, the storage unit 5 stores plural functions to each film thickness of the thin film and to each combination of the process conditions of the ion implantation process and the anneal treatment. The size function information 55a and 55b is used when the control unit 4 predicts the sheet resistance based on the processing result information 53.

Returning to the explanation of FIG. 2, the explanation of the adjusting apparatus 3 will be continued. The in-furnace position coefficient information 56 is information for causing the in-furnace positions B, C, D, and E of the substrates 26, which are sent from the film forming device 21 to the processing device 22, in the film forming furnace 25 to correspond to a predetermined in-furnace position coefficient.

The in-furnace position coefficient information 56 is used when the control unit 4 corrects the sheet resistance predicted based on the film thickness function information 54. As described above, the film quality of the thin films formed in the film forming step is different depending on the in-furnace positions B, C, D, and E in the film forming furnace 25, and the difference of the film quality causes a final sheet resistance to change depending on the in-furnace positions B, C, D, and E at which the thin films have been formed.

Accordingly, it is necessary to correct the sheet resistances predicted based on the thickness function information 54 to each of the in-furnace positions B, C, D, and E. Thus, in the adjusting apparatus 3, the in-furnace position coefficient information 56 for causing the in-furnace positions B, C, D, and E of the substrates 26, which are sent from the film forming device 21 to the processing device 22, in the film forming furnace 25 to correspond to the predetermined in-furnace position coefficient is stored in the storage unit 5.

Here, an example of the in-furnace position coefficient information 56 will be explained using FIG. 6. FIG. 6 is a view illustrating an example of the in-furnace position coefficient information 56 according to the first embodiment. Note that the in-furnace positions B, C, D, and E illustrated in FIG. 6 correspond to the in-furnace positions B, C, D, and E illustrated in FIG. 3.

As described above, in the film forming furnace 25 of the film forming device 21, the grain size of the polysilicon tends to become larger and the sheet resistance tends to become smaller as the in-furnace positions B, C, D, and E of the substrates 26 to which the thin films are formed are located in upper stages in the film forming furnace 25.

Thus, as illustrated in FIG. 6, in the in-furnace position coefficient information 56, in-furnace position coefficients $\alpha$, $\beta$, $\gamma$, and $\delta$, which become smaller as the in-furnace positions B, C, D, and E are located in the upper stages in the film forming furnace 25, are caused to correspond to the respective in-furnace positions B, C, D, and E, respectively, Then, the control unit 4 corrects the sheet resistance predicted to each of the in-furnace positions B, C, D, and E by multiplying the in-furnace position coefficients $\alpha$, $\beta$, $\gamma$, and $\delta$ which correspond to the in-furnace positions B, C, D, and E at which the thin films have been formed to the sheet resistances of the thin films predicted based on the film thickness function information 54.

Returning to the explanation of FIG. 2, the dose amount function information 57 is a function showing the relation between the dose amount of the impurity ions ion implanted to the thin film and the sheet resistance of the resistor element. Further, the anneal temperature function information 58 is a function showing the relation between the process temperature in the anneal treatment and the sheet resistance of the thin film.

Figure 7A:
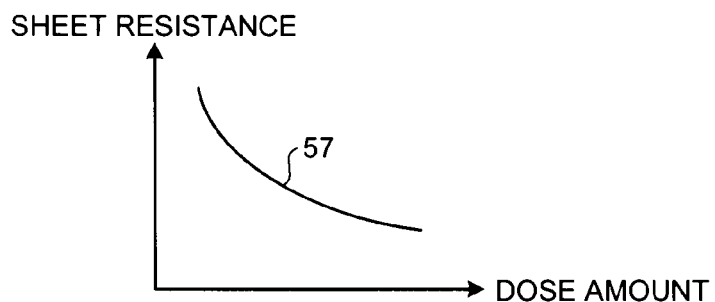
FIG. 7A is an explanatory view illustrating an example of dose amount function information according to the first embodiment.
Figure 7B:
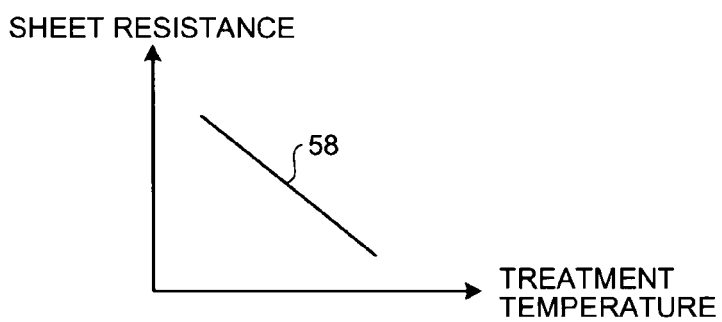
FIG. 7B is an explanatory view illustrating an example of anneal temperature function information according to the first embodiment.

Here, examples of the dose amount function information 57 and the anneal temperature function information 58 will be explained using FIG. 7A and FIG. 7B. FIG. 7A is an explanatory view illustrating an example of the dose amount function information 57 according to the first embodiment, and FIG. 7B is an explanatory view illustrating an example of the anneal temperature function information 58 according to the first embodiment.

As illustrated in FIG. 7A, the dose amount function information 57 is a function showing the relation between the dose amount of the impurity ions shown by the following expression and the sheet resistance of the resistor element.

$$\text{dose amount} = e \times (\text{sheet resistance})^2 - f \times (\text{sheet resistance}) + g \quad \text{Expression (3)}$$

Note that e, f, and g in the expression (3) are positive constants calculated from the film forming conditions of the thin film and the film thickness and the size of the thin film. As illustrated in the drawing, an increase of the dose amount more reduces the resistance value of the sheet resistance. Further, the increase of the dose amount more reduces the reduction rate of the sheet resistance.

Note that although FIG. 7A exemplifies a function as the dose amount function information 57, the storage unit 5 stores plural functions to each film forming condition of the thin film and to each combination of the film thickness and the size of the thin film. The dose amount function information 57 is used when the control unit 4 adjusts the process conditions of the ion implantation process.

Further, as illustrated in FIG. 7B, the anneal temperature function information 58 is a function showing the relation between the sheet resistance shown by the following expression and the treatment temperature of the anneal treatment.

$$\text{sheet resistance} = -h \times (\text{anneal temperature}) + i \quad \text{Expression (4)}$$

Note that h and i in the expression (4) are positive constants calculated from the film forming conditions of the thin film and the film thickness and the size of the thin film. As illustrated in the drawing, an increase of the treatment temperature of the anneal treatment more reduces the resistance value of the sheet resistance.

Note that although FIG. 7B exemplifies a function as the anneal temperature function information 58, the storage unit 5 stores plural functions to each of the film forming conditions of the thin film and to each combination of the film thicknesses and the sizes of the thin film. The anneal temperature function information 58 is used when the control unit 4 adjusts the process conditions of the anneal treatment.

Note that the adjusting apparatus 3 may be configured to cause the storage unit 5 to store information showing relation between the treatment time of the anneal treatment and the sheet resistance in addition to the anneal temperature function information 58 and to cause the control unit 4 to adjust the treatment conditions of the anneal treatment based on the information. Further, the sheet resistance information 59 is an object value as to a predetermined sheet resistance of the resistor element.

The control unit 4 is a processing unit for integrally controlling the overall operation of the adjusting apparatus 3 and is an information processing device having, for example, a CPU (Central Processing Unit), ROM (Read Only Memory), and RAM (Random Access Memory).

The control unit 4 includes a film formation correction unit 41, a shape correction unit 42, and an adjusting unit 43 which functions by that the CPU reads various types of programs from the ROM and executes the programs using the RAM as a working area.

The film formation correction unit 41 is a processing unit for executing a correction so that the film thickness of the thin film formed in the film forming step becomes a previously set desired film thickness by adjusting the film forming conditions set to the film forming device 21.

Specifically, each time the thin film is formed by the film forming device 21, the film formation correction unit 41 obtains the film forming conditions such as the temperature in the film forming furnace 25 at the time of film formation, the film forming time, the flow rate of the material gas introduced into the film forming furnace 25, the pressure in the film forming furnace 25, and the like from the film forming device 21. Then, the film formation correction unit 41 causes the storage unit 5 to sequentially store the respective obtained film forming conditions as the film forming device information 50.

Further, each time the thin film is formed by the film forming device 21, the film formation correction unit 41 obtains the measurement result of the film thickness of the formed thin film as the film formation result and causes the storage unit 5 to store the obtained film formation result as the film formation result information 51.

Then, the film formation correction unit 41 outputs and sets the film forming conditions, which have been adjusted based on the film forming device information 50 and the film formation result information 51 so that the film thickness of a thin film formed next time agrees with the film thickness formed this time, to the film forming device 21. With the operation, the film thickness of the thin film formed in the film forming step is corrected so as to approach the previously set desired film thickness.

The shape correction unit 42 is a processing unit for correcting the size of the thin film processed in the processing step so that the size of the thin film becomes the previously set desired size by adjusting the processing conditions set to the processing device 22.

Specifically, each time the shape of the thin film is processed by the processing device 22, the shape correction unit 42 obtains the processing conditions such as the type of the exposure mask used at the time of photography, the position information of the exposure mask at the time of exposure, and the like from the processing device 22. Then, the shape correction unit 42 causes the storage unit 5 to sequentially store the respective obtained processing conditions as the processing device information 52.

Further, each time the shape of the thin film is processed by the processing device 22, the shape correction unit 42 obtains the measurement result as to the sizes of the processed thin films as the processing result and causes the storage unit 5 to store the obtained processing result as the processing result information 53.

Then, the shape correction unit 42 outputs and sets the processing conditions which have been adjusted based on the processing device information 52 and the processing result information 53 so that the size of the thin film formed next time agrees with the size of the thin film processed this time to the processing device 22. With the operation, the size of the thin film formed by the processing step is corrected so as to approach the previously set desired size.

The adjusting unit 43 is a processing unit for suppressing the dispersion of the sheet resistance of the resistor element by adjusting the process conditions of the ion implantation process by the ion implantation device 23 and the process conditions of the anneal treatment by the anneal device 24 based on the various types of information stored by the storage unit 5.

When the process conditions of the ion implantation process and the anneal treatment are adjusted, the adjusting unit 43 predicts the sheet resistance of the resistor element created using the thin film formed by the film forming step and the sheet resistance of the resistor element created using the thin film processed by the processing step.

Specifically, when the thin film is formed by the film forming device 21, the adjusting unit 43 reads the film forming device information 50 and the film formation result information 51 from the storage unit 5 and discriminates the film thickness of the thin film formed by the film forming step based on the read film forming device information 50 and film formation result information 51.

For example, the adjusting unit 43 discriminates the film thickness obtained by averaging the film thickness calculated from the film forming device information 50 stored by the storage unit 5 and the film thickness stored by the storage unit 5 as the film formation result information 51 as the film thickness of the thin film formed by the film forming step.

Note that the adjusting unit 43 may discriminate the film thickness calculated from the film forming device information 50 as the film thickness of the thin film formed by the film forming step and may discriminate the film thickness stored in the storage unit 5 as the film formation result information 51 as the film thickness of the thin film formed by the film forming step.

Subsequently, the adjusting unit 43 reads the film thickness function information 54 from the storage unit 5 and calculates the sheet resistance by substituting the discriminated film thickness for the expression (1) of the read film thickness function information 54. At the time, the adjusting unit 43 calculates the sheet resistance to each of the in-furnace positions B, C, D, and E of the film forming furnace 25.

Subsequently, the adjusting unit 43 calculates the predicted values of the sheet resistances of the resistor elements formed using the thin films formed by the film forming step by multiplying the corresponding in-furnace coefficients $\alpha$, $\beta$, $\gamma$, and $\delta$ of the in-furnace position coefficient information 56 to respective sheet resistances calculated to the respective in-furnace positions B, C, D, and E, respectively. With the operation, the adjusting unit 43 can accurately calculate the predicted values of the sheet resistances in consideration of the in-furnace positions B, C, D, and E.

Further, when the shape of the thin film has been processed by the processing device 22, the adjusting unit 43 predicts the sheet resistance of the resistor element created using the thin film processed by the processing step. Specifically, the adjusting unit 43 reads the processing result information 53 and the size function information 55a and 55b from the storage unit 5.

Subsequently, the adjusting unit 43 calculates the predicted value of the sheet resistance by substituting the size of the thin film in the processing result information 53 for the expression (2) of the size function information 55a and 55b. At the time, the adjusting unit 43 calculates the predicted value of the sheet resistance to each of the measurement regions G, H, and I of the size (refer to FIG. 4).

Then, the adjusting unit 43 adjusts the process conditions of the ion implantation process and the anneal treatment using the calculated predicted value of the sheet resistance. Here, procedures for adjusting the process conditions of the ion implantation process and the anneal treatment will be explained using FIG. 8A and FIG. 8B.

Figure 8A:
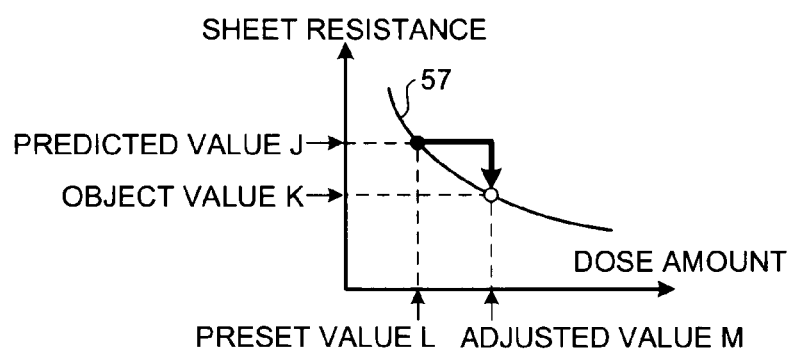
FIG. 8A is an explanatory view illustrating a procedure for adjusting the process conditions of an ion implantation process according to the first embodiment.
Figure 8B:
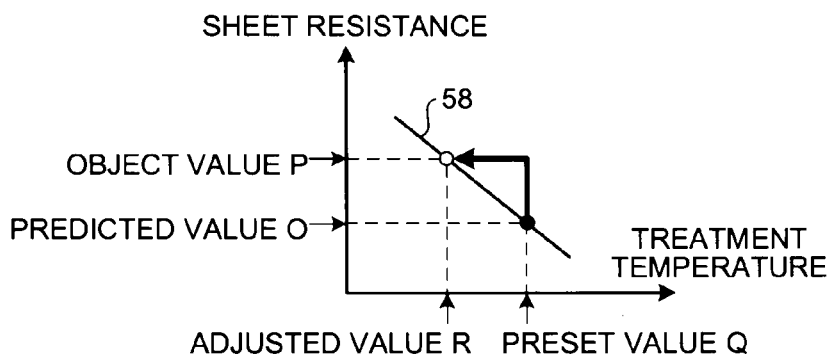
FIG. 8B is an explanatory view illustrating a procedure for adjusting the treatment conditions of an anneal treatment according to the first embodiment.

FIG. 8A is an explanatory view illustrating a procedure for adjusting the process conditions of the ion implantation process according to the first embodiment, and FIG. 8B is an explanatory view illustrating a procedure for adjusting the treatment conditions of the anneal treatment according to the first embodiment.

As illustrated in FIG. 8A, when the process conditions of the ion implantation process are adjusted, the adjusting unit 43 compares a calculated predicted value J of the sheet resistance with an object value K stored as the sheet resistance information 59. Then, when the predicted value J of the sheet resistance is larger than the object value K of the sheet resistance, the adjusting unit 43 increases the preset value L of the dose amount set to the ion implantation device 23 up to an adjusted value M based on the dose amount function information 57. In contrast, when the predicted value J of the sheet resistance is smaller than the object value K of the sheet resistance, the adjusting unit 43 reduces the dose amount set to the ion implantation device 23.

As described above, when an error occurs between the film thickness and the size of the thin film formed in the upstream steps and a predetermined desired film thickness and size, the adjusting unit 43 can approach the final sheet resistance of the resistor element to the object value K by adjusting the process conditions of the ion implantation process in the downstream steps. Thus, according to the manufacturing system 1, occurrence of dispersion in the sheet resistance of the resistor element can be suppressed.

Further, as illustrated in FIG. 8B, when the treatment conditions of the anneal treatment are adjusted, the adjusting unit 43 compares the calculated predicted value O of the sheet resistance with an object value P stored as the sheet resistance information 59. Then, when the predicted value O of the sheet resistance is smaller than the object value P of the sheet resistance, the adjusting unit 43 reduces the preset value Q of the treatment temperature set to the anneal device 24 up to an adjusted value R based on the anneal temperature function information 58. In contrast, when the predicted value O of the sheet resistance is larger than the object value P of the sheet resistance, the adjusting unit 43 increases the treatment temperature set to the anneal device 24.

Further, when the process conditions of the anneal treatment are adjusted, the adjusting unit 43 adjusts the treatment conditions to each of the measurement regions G, H, I in which the sizes of the thin films have been measured, that is, to each of the positions of the thin films on the substrate 26 based on the processing result information 53.

As described above, when the error occurs between the film thickness and the size of the thin film formed in the upstream steps and the predetermined desired film thickness and size, the adjusting unit 43 adjusts the treatment conditions of the anneal treatment in the downstream steps to each of the positions of the thin films on the substrate 26. With the operation, in the manufacturing system 1, since the final sheet resistance of the resistor element can be approached to the object value P, occurrence of dispersion in the sheet resistance of the resistor element can be suppressed.

Figure 9:
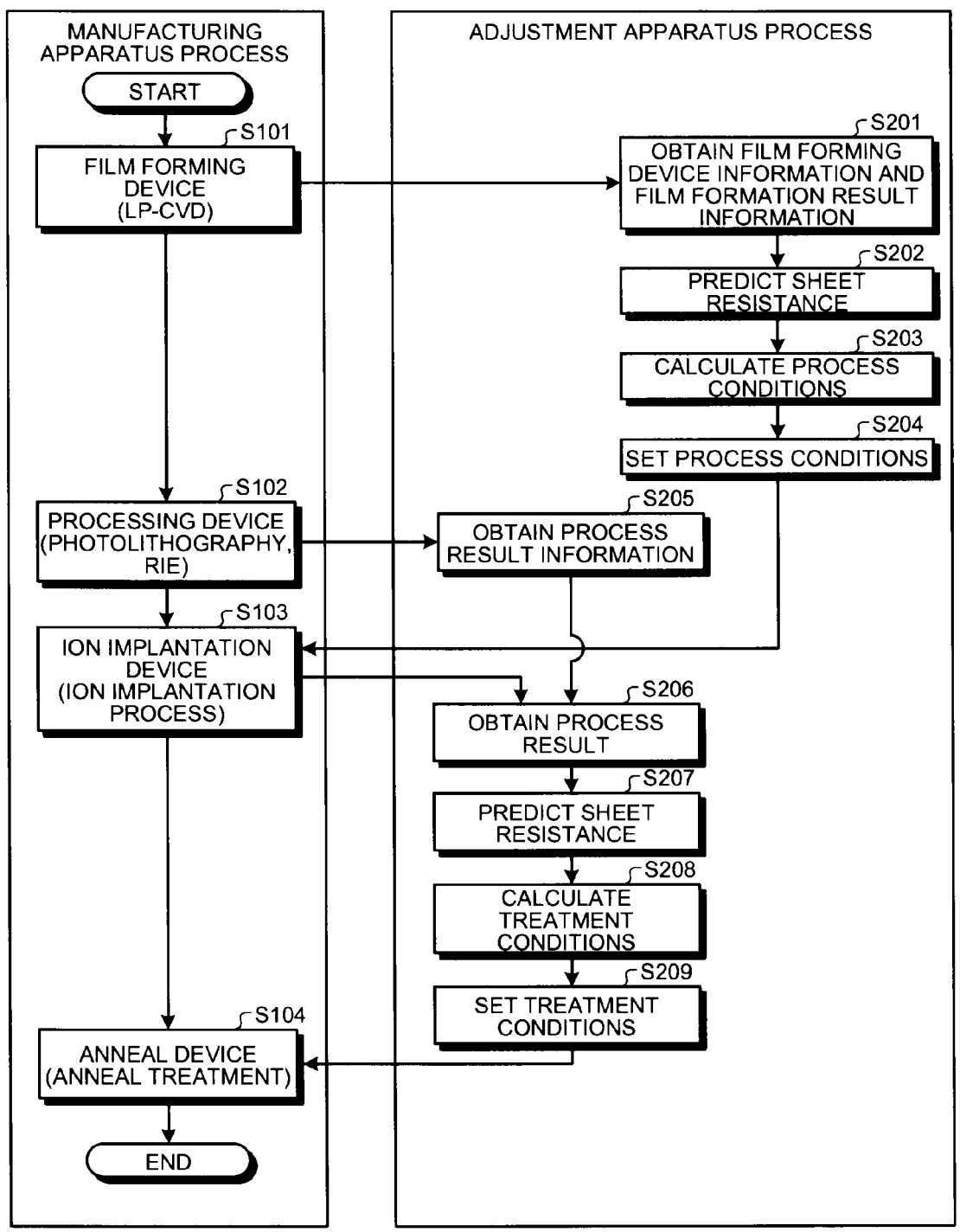
FIG. 9 is a view illustrating an example of a manufacturing apparatus process and an adjusting apparatus process according to the first embodiment.

Next, a manufacturing apparatus process executed by the manufacturing apparatus 2 and an adjusting apparatus process executed by the adjusting apparatus 3 in the manufacturing system 1 according to the first embodiment will be explained using FIG. 9. FIG. 9 is a view illustrating an example of the manufacturing apparatus process and the adjusting apparatus process according to the first embodiment.

As illustrated in FIG. 9, in the manufacturing system 1, a thin film of polysilicon is formed on the substrate 26 by that the film forming device 21 executes LP-CVD (step S101). In contrast, when the thin film has been formed by the film forming device 21, the adjusting apparatus 3 obtains the film forming device information 50 and the film formation result information 51 from the film forming device 21 (step S201).

Subsequently, the adjusting apparatus 3 predicts the sheet resistance of the resistor element created by the thin film formed by the film forming device 21 based on the obtained film forming device information 50 and film formation result information 51 (step S202). Subsequently, the adjusting apparatus 3 calculates the process conditions of the ion implantation process capable of reducing the difference between the predicted sheet resistance and the predetermined desired resistance value (step S203) and sets the calculated process conditions to the ion implantation device 23 (step S204).

Further, when the substrate 26 to which the thin film is formed by the film forming device 21 is carried, the processing device 22 processes the thin film formed to the carried substrate 26 to the shape of the resistor element by photolithography and RIE (step S102).

Subsequently, when the substrate 26 to which the shape is processed by the processing device 22 is carried, the ion implantation device 23 executes the ion implantation process of the impurity ions to the carried substrate 26 in the process conditions set by the adjusting apparatus 3 (step S103).

In contrast, when the thin film is processed to the shape of the resistor element by the processing device 22, the adjusting apparatus 3 obtains the processing result information 53 from the processing device 22 (step S205). Subsequently, the adjusting apparatus 3 obtains the process result of the ion implantation process from the ion implantation device 23 (step S206).

Subsequently, the adjusting apparatus 3 predicts the final sheet resistance of the resistor element based on the processing result information 53 obtained from the processing device 22 and the process result obtained from the ion implantation device 23 (step S207).

Subsequently, the adjusting apparatus 3 calculates the treatment conditions of the anneal treatment capable of reducing the difference between the predicted sheet resistance and the predetermined desired resistance value (step S208) and sets the calculated treatment conditions to the anneal device 24 (step S209). Finally, the anneal device 24 executes the anneal treatment in the treatment conditions set by the adjusting apparatus 3 (step S104) and creates the resistor element.

As described above, in the first embodiment described above, the error occurred in the upstream steps is corrected in the downstream steps by that the adjusting apparatus 3 of the manufacturing system 1 adjusts the process conditions of the ion implantation process as a downstream step based on the process conditions and the process result of the film forming step as an upstream step.

Further, in the manufacturing system 1, the error occurred in the upstream steps is corrected by that the adjusting apparatus 3 adjusts the treatment conditions of the anneal treatment as a downstream step based on the processing result of the processing step as an upstream step and the process result of the ion implantation process executed in the process conditions after the adjustment.

With the operation, in the manufacturing system 1, even if the error occurs in the upstream steps, since the sheet resistance of the resistor element which becomes the final product can be approached to the predetermined desired resistance value, occurrence of dispersion in the sheet resistance of the resistor element can be suppressed.

Note that the manufacturing apparatus process and adjusting apparatus process are not limited to the processes illustrated in FIG. 9. Hereinafter, modifications 1 to 3 of the manufacturing apparatus process and adjusting apparatus process according to the first embodiment will be explained using FIG. 10 to FIG. 12.

Figure 10:
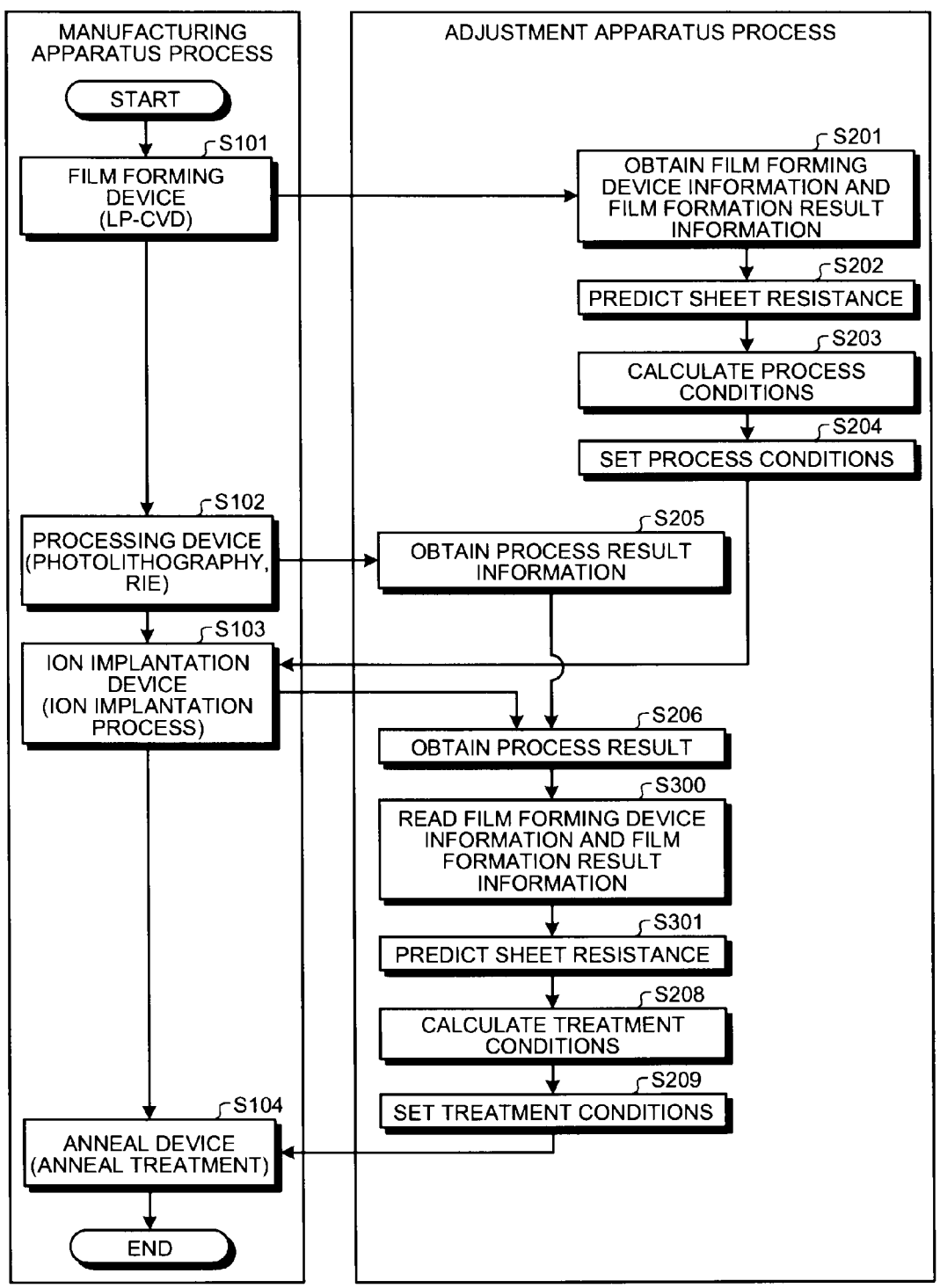
FIG. 10 is a view illustrating an example of a manufacturing apparatus process and an adjusting apparatus process according to a modification 1.
Figure 11:
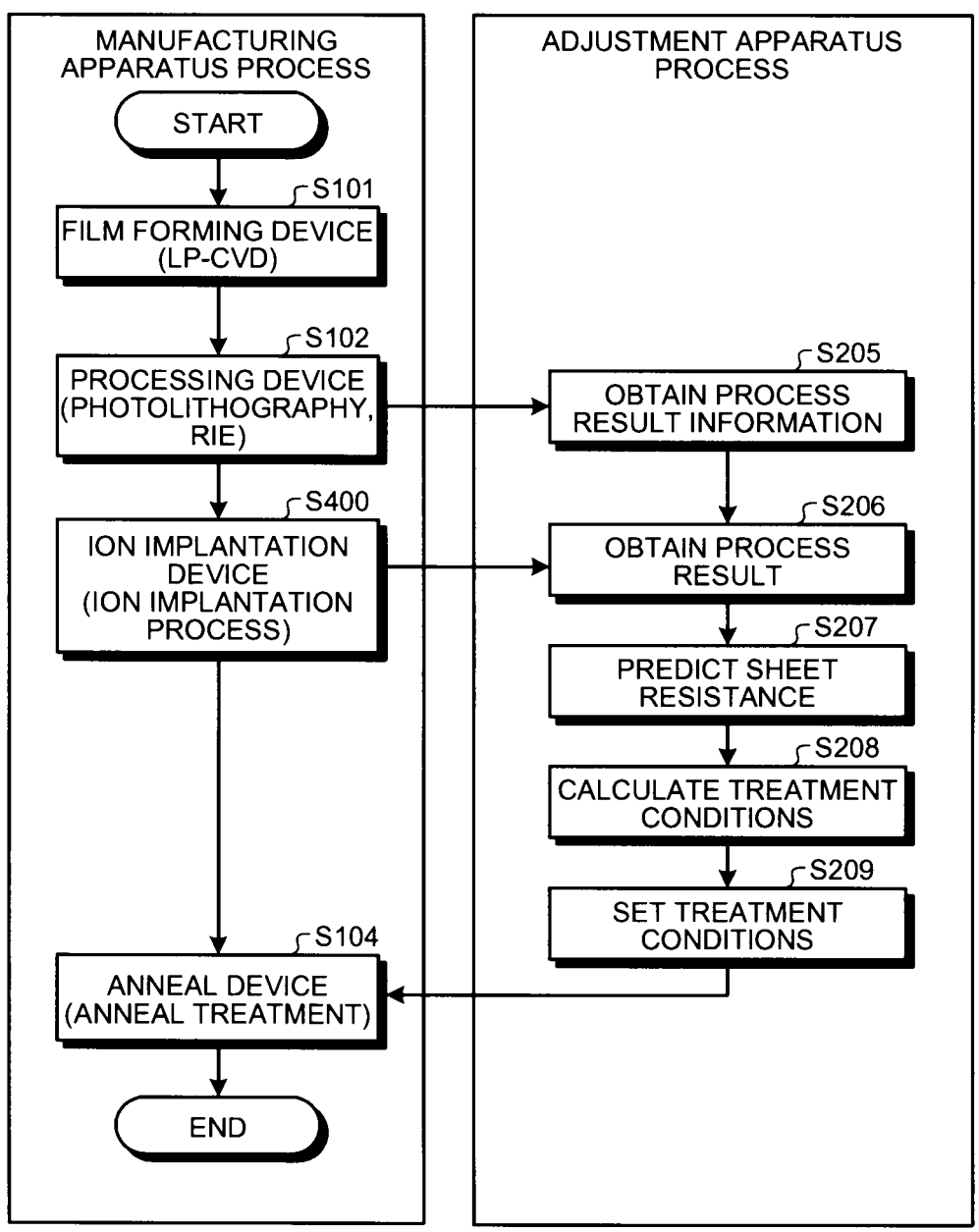
FIG. 11 is a view illustrating an example of a manufacturing apparatus process and an adjusting apparatus process according to a modification 2.
Figure 12:
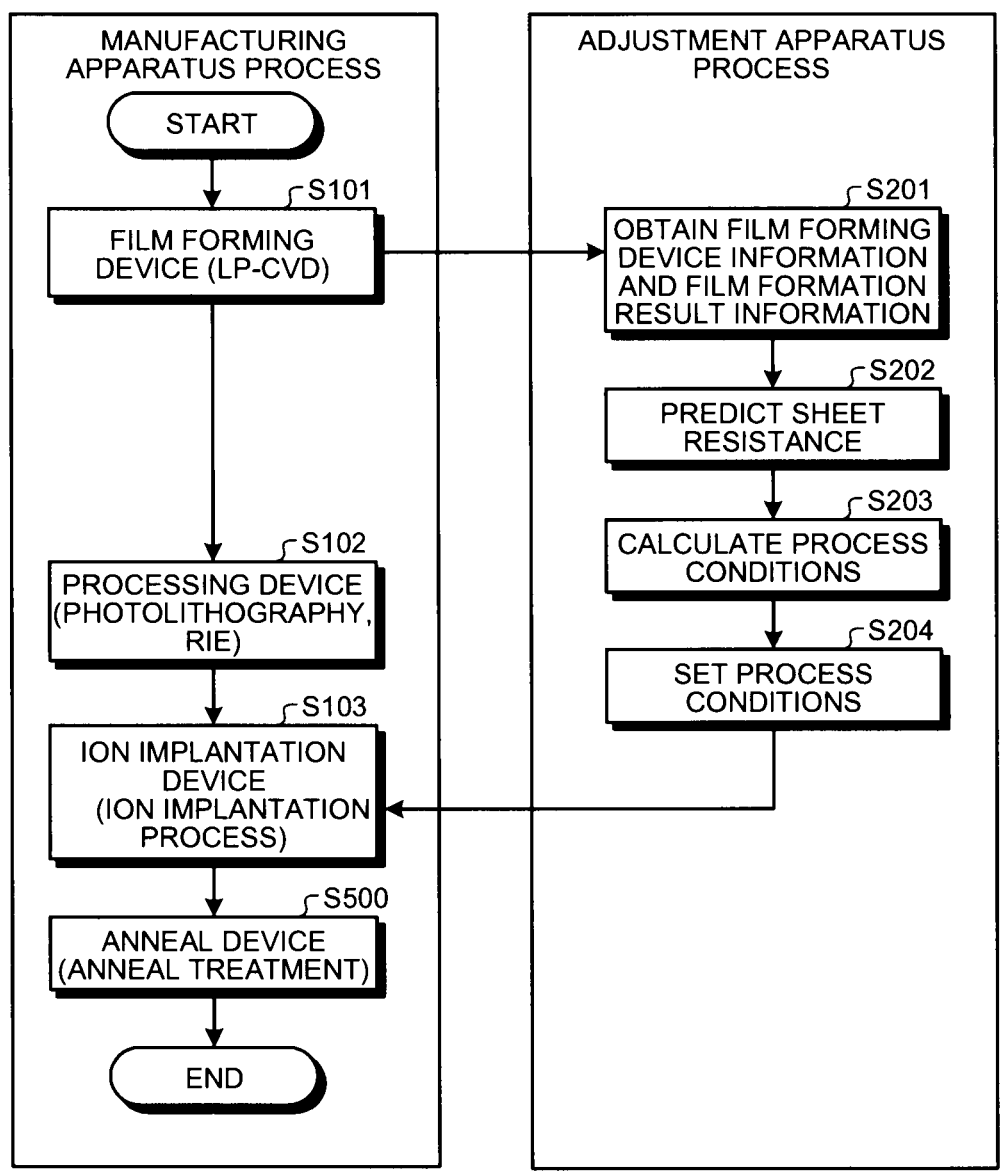
FIG. 12 is a view illustrating an example of a manufacturing apparatus process and an adjusting apparatus process according to a modification 3.

FIG. 10 is a view illustrating an example of a manufacturing apparatus process and an adjusting apparatus process according to the modification 1, FIG. 11 is a view illustrating an example of a manufacturing apparatus process and an adjusting apparatus process according to the modification 2, and FIG. 12 is a view illustrating an example of a manufacturing apparatus process and an adjusting apparatus process according to the modification 3.

Note that, in FIG. 10 to FIG. 12, the same processes as the processes illustrated in FIG. 9 are denoted by the same step numbers. As illustrated in FIG. 10, in the modification 1, only step S300 and step S301 in the adjusting apparatus process are different from the processes illustrated in FIG. 9.

That is, an adjusting apparatus 3 according to the modification 1 corrects an error which occurs in upstream steps in downstream steps by adjusting the process conditions of an ion implantation process as a downstream step based on the process conditions and the process result of a film forming step as an upstream step likewise the process illustrated in FIG. 9.

Further, after the adjusting apparatus 3 obtains processing result information 53 from a processing device 22 (step S205) and obtains the process result of an ion implantation device 23 (step S206), the adjusting apparatus 3 reads film forming device information 50 and film formation result information 51 from a storage unit 5 (step S300).

Subsequently, the adjusting apparatus 3 predicts a final sheet resistance based on the processing result information 53, the process result of the ion implantation process, the film forming device information 50, and the film formation result information 51 (step S301). Thereafter the adjusting apparatus 3 calculates the treatment conditions of an anneal treatment based on the predicted sheet resistance (step S208) and sets the treatment conditions to an anneal device 24 (step S209).

As described above, the adjusting apparatus 3 according to the modification 1 adjusts the process conditions of the anneal treatment again in consideration of the film forming device information 50 and film formation result information 51 in addition to the processing result information 53 and the process result of the ion implantation process. With the operation, according to a manufacturing system according to the modification 1, the sheet resistance of a resistor element which becomes a final product can be more accurately approached to a predetermined desired resistance value.

Further, as illustrated in FIG. 11, the modification 2 is different from the processes illustrated in FIG. 9 in the point that an ion implantation device 23 executes an ion implantation process in predetermined process conditions (step S400) and the point that an adjusting apparatus 3 executes the processes of the steps S205 to 209 illustrated in FIG. 9.

Further, as illustrated in FIG. 12, the modification 3 is different from the processes illustrated in FIG. 9 in the point that an anneal device 24 executes an anneal treatment in previously set treatment conditions (step S500) and the point that the adjusting apparatus 3 executes the processes of the steps S201 to 204 illustrated in FIG. 9.

When an error occurs in the upstream steps, since the sheet resistance of the resistor element which becomes the final product can be approached to the predetermined desired resistance value also by the modification 2 and modification 3, occurrence of dispersion in the sheet resistance of the resistor element can be suppressed.

Moreover, according to the modification 2 and the modification 3, since what is required to the adjusting apparatus 3 is only to calculate the process conditions of any one of the ion implantation process or the anneal treatment and to set the process conditions to a corresponding device, the dispersion of the sheet resistance can be suppressed while reducing a process load.

Note that, in the first embodiment and the modifications 1 to 3 described above, although the case that the adjusting apparatus 3 adjusts the dose amount of the ion implantation process has been explained, the adjusting apparatus 3 may adjust the ion implantation time of the ion implantation process. Further, the adjusting apparatus 3 may adjust both the dose amount and the ion implantation time. When the configuration is employed, the adjusting apparatus 3 adjusts the dose amount and the ion implantation time so that the process time is minimized.

Further, in the first embodiment and the modifications 1 to 3 described above, although the case that the adjusting apparatus 3 adjusts the treatment temperature of the anneal treatment has been explained, the adjusting apparatus 3 may adjust the treatment time of the anneal treatment. Further, the adjusting apparatus 3 may adjust both the treatment temperature and the treatment time of the anneal treatment. When the configuration is employed, the adjusting apparatus 3 adjusts the treatment temperature and the treatment time so that the process time is minimized shortest.

Second Embodiment

Figure 13:
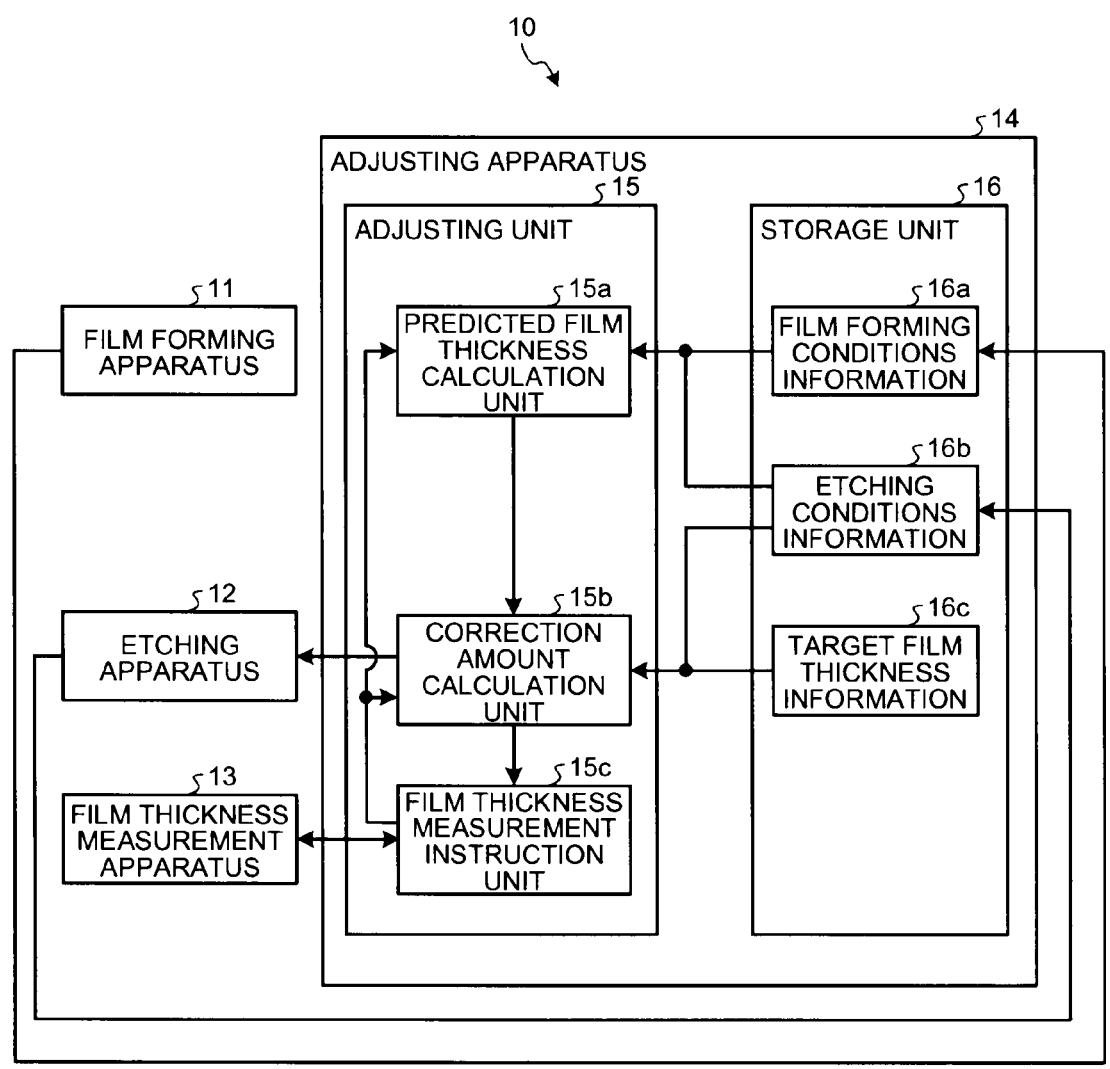
FIG. 13 is an explanatory view illustrating a configuration of a manufacturing system according to a second embodiment.

Next, a manufacturing method by a manufacturing system according to a second embodiment will be explained. FIG. 13 is an explanatory view illustrating a configuration of the manufacturing system 10 according to the second embodiment. Note that FIG. 13 illustrates the components which are necessary to explain the feature of the manufacturing system 10 and the illustration of ordinary components is omitted.

As illustrated in FIG. 13, the manufacturing system 10 is a system which includes a film forming apparatus 11, an etching apparatus 12, a film thickness measurement apparatus 13, and an adjusting apparatus 14 and etches a thin film of semiconductor and reduces a film thickness to a desired film thickness (hereinafter, described as "target film thickness") after the manufacturing system 10 has formed the thin film.

Specifically, the film forming apparatus 11 includes an oxidation furnace for oxidizing a substrate such as a silicon wafer and the like and a wafer in which a semiconductor layer such as a silicon layer and the like is formed on a substrate. Then, the film forming apparatus 11 forms oxidized thin films of semiconductor (hereinafter, described as "oxide films") on plural wafers by heat treating the wafers in the oxidation furnace.

The film forming apparatus 11 executes a film forming step of the oxidized films in previously set predetermined film forming conditions. Note that the film forming conditions are optionally set and changed depending a use and the like of the oxide films to be formed. Then, when the film forming conditions are set or before the oxide films are formed, or after the oxide films are formed, the film forming apparatus 11 outputs film forming conditions information 16a showing the film forming conditions to the adjusting apparatus 14. An example of the film forming conditions information 16a will be described later referring to FIG. 14.

The etching apparatus 12 is an apparatus for reducing the film thickness of the oxide films to the target film thickness by wet etching the oxide films formed by the film forming apparatus 11. The etching apparatus 12 executes an etching step of the oxide films in previously set predetermined etching conditions or the etching conditions adjusted by the adjusting apparatus 14.

Further, before etching is executed, the etching apparatus 12 outputs etching conditions information 16b showing the etching conditions of the etching step to be executed from the time to the adjusting apparatus 14. Note that an example of the etching conditions information 16b will be described later referring to FIG. 15.

The film thickness measurement apparatus 13 is an apparatus for measuring the film thickness of the oxide films formed by the film forming apparatus 11 and the film thickness of the oxide films etched by etching apparatus 12. When a film thickness measurement instruction is input from the adjusting apparatus 14, the film thickness measurement apparatus 13 measures the film thickness of the oxide films and outputs a measurement result to the adjusting apparatus 14.

The adjusting apparatus 14 is an apparatus for adjusting the etching conditions in the etching apparatus 12 based on the film forming conditions of the oxide films in the film forming apparatus 11 and the etching conditions in the etching apparatus 12. Specifically, the adjusting apparatus 14 includes an adjusting device 15 and a storage unit 16.

The storage unit 16 stores the film forming conditions information 16a input from the film forming apparatus 11, the etching conditions information 16b input from the etching apparatus 12, and target film thickness information 16c. Note that the target film thickness information 16c is information showing the target film thickness of the oxide films and can be optionally set and changed from the outside.

Here, the film forming conditions information 16a and the etching conditions information 16b will be explained referring to FIG. 14 and FIG. 15. FIG. 14 is an explanatory view illustrating an example of the film forming conditions information 16a according to the second embodiment, and FIG. 15 is an explanatory view illustrating an example of the etching conditions information 16b according to the second embodiment.

As illustrated in FIG. 14, the film forming conditions information 16a includes information showing inside-apparatus positions, a process temperature, a process pressure, a gas flow rate, and a process time, respectively. The inside-apparatus position is information showing positions where wafers are placed in the oxidation furnace. In the embodiment, the respective regions in the oxidation furnace are denoted by numbers 1, 2, 3, showing the inside-apparatus positions.

Further, the process temperature is a temperature in the oxidation furnace when the oxide films are formed, and the process pressure is the atmosphere in the oxidation furnace when the oxide films are formed. Further, the gas flow rate is the flow rate (volume) of a process gas introduced into the oxidation furnace in a unit time when the oxide films are formed, and the process time is a process time necessary to form the oxide films.

Here, s, t, u, v in FIG. 14 are numerical values showing the process temperature, the process pressure, the gas flow rate, and the process time in the film forming conditions information 16a, respectively. Note that information and the like showing, for example, a type of the process gas and the concentration of the process gas in the oxidation furnace may be included as the film forming conditions information 16a in addition to the information illustrated FIG. 14.

Further, as illustrated in FIG. 15, the etching conditions information 16b includes the information showing the process time, the process number of times, the process temperature respectively. The process time is a process time necessary to wet etching of the oxide films, the process number of times is a number of times of etching repeatedly executed to the same wafer in a predetermined unit time, and the process temperature is the temperature of an etchant used in the wet etching.

Here, w, x, y in FIG. 15 are numerical values showing the process time, the process number of times, and the process temperature in the etching conditions information 16b, respectively. Note that, as the etching conditions information 16b, information and the like showing, for example, a type and a concentration of the etchant may be included in addition to the information illustrated in FIG. 15.

Next, returning to FIG. 13, the adjusting device 15 will be explained. The adjusting device 15 is a processing unit for approaching the film thickness of the oxide film after the etching to the target film thickness by adjusting the etching conditions in the etching apparatus 12 based on the respective information stored in the storage unit 16.

Specifically, the adjusting device 15 includes a predicted film thickness calculation unit 15a, a correction amount calculation unit 15b, and a film thickness measurement instruction unit 15c. The predicted film thickness calculation unit 15a is a processing unit for calculating a predicted film thickness of the oxide film after the etching step using the film forming conditions information 16a and the etching conditions information 16b stored by the storage unit 16 and outputs the predicted film thickness to the corrected amount calculation unit 15b.

The predicted film thickness calculation unit 15a calculates the predicted film thickness by substituting the numerical values of the respective information included in the film forming conditions information 16a read from the storage unit 16 and the reduction amount of the film thickness of the oxide film when the etching is executed under the etching conditions corresponding to etching conditions information 16b read from the storage unit 16 for the following expression.

$$\text{predicted film thickness} = j \times (\text{process temperature}) + k \times (\text{process time}) + l \times (\text{gas flow rate}) + m \times (\text{process pressure}) + n \times (\text{in-apparatus position}) + o \quad \text{Expression (5)}$$

Here, the process temperature in the expression (5) is a process temperature in the film forming step and the process time is a process time in the film forming step. Further, j in the expression (5) is a constant showing a change rate of the film thickness of the oxide film due to the change of the process temperature, k is a constant showing a change rate of the film thickness of the oxide film due to the change of the process time, and l is a constant showing a change rate of the film thickness of the oxide film due to the change of the gas flow rate.

Further, m in the expression (5) is a constant showing a change rate of the film thickness of the oxide film due to the change of the process pressure, and n is a constant showing a change rate of the film thickness of the oxide film due to the difference of the in-apparatus position. Further, o in the expression (5) is a negative numerical value showing a reduction amount of the film thickness of the oxide film which is reduced when the wet etching is executed under the etching conditions corresponding to the etching conditions information 16b stored by the storage unit 16.

These constant j, k, l, m, n, and o are constants previously calculated based on the result of a test repeated to form and etch an oxide film by changing the film forming conditions and the etching conditions.

The corrected amount calculation unit 15b is a processing unit for calculating a correction amount of the etching time based on the predicted film thickness of the oxide film after the etching step input from the predicted film thickness calculation unit 15a and on the etching conditions information 16b and the target film thickness information 16c stored in the storage unit 16.

The corrected amount calculation unit 15b calculates the correction amount of the etching time by substituting the predicted film thickness input from the predicted film thickness calculation unit 15a, the etching rate calculated using the etching conditions information 16b read from the storage unit 16, and the target film thickness corresponding to the target film thickness information 16c for the next expression.

$$\text{correction amount of etching time} = \{(\text{predicted film thickness}) - (\text{target film thickness})\} / (\text{etching rate}) \quad \text{Expression (6)}$$

Here, the etching rate is an etching amount of the oxide film which is etched in the predetermined unit time when the etching is executed at the process temperature and in the process number of times in the etching conditions information 16b stored by the storage unit 16.

The etching rate is calculated by the correction amount calculation unit 15b by the following expression.

$$\text{etching rate} = p \times (\text{process temperature}) + q \times (\text{process number of times}) + r \quad \text{Expression (7)}$$

Note that the process temperature in the expression (7) is a process temperature in the etching step. Further, constants p, q, r in the expression (7) are constants previously calculated based on the result of a test repeated to etch the oxide film by changing the etching conditions.

Then, the correction amount calculation unit 15b sets and changes the etching time by correcting the etching time by the etching apparatus 12 based on the correction amount of the calculated etching time and outputting the etching time after correction to the etching apparatus 12.

That is, when the calculated correction amount is positive, the correction amount calculation unit 15b outputs the time obtained by adding the correction amount to the process time in the etching conditions information 16b stored in the storage unit 16 to etching apparatus 12 as the etching time after correction.

In contrast, when calculated correction amount is negative, the correction amount calculation unit 15b outputs the time obtained by subtracting the correction amount from the process time in the etching conditions information 16b stored in the storage unit 16 to the etching apparatus 12 as the etching time after correction.

Then, when the etching time after correction is input from the correction amount calculation unit 15b, the etching apparatus 12 updates the etching conditions information 16b by outputting the etching time after correction to the storage unit 16 of the adjusting apparatus 14 and etches the oxide film for the etching time after correction. Further, the correction amount calculation unit 15b outputs the etching time after correction to the film thickness measurement instruction unit 15c.

The film thickness measurement instruction unit 15c is a processing unit for determining whether or not the etching time after correction input from the correction amount calculation unit 15b departs from the predetermined etching conditions and outputs a film thickness measurement instruction of the oxide film to the film thickness measurement apparatus 13 when the film thickness measurement instruction unit 15c determines that the etching time after correction departs from the predetermined etching conditions.

For example, when the etching time after correction exceeds the upper limit value of a predetermined time range and when the etching time after correction becomes lower than the lower limit value thereof, the film thickness measurement instruction unit 15c determines that the etching time after correction departs from the predetermined etching conditions.

Then, when the film thickness measurement instruction is input from the film thickness measurement instruction unit 15c, the film thickness measurement apparatus 13 measures the film thickness of the oxide film formed by the film forming apparatus 11 and the film thickness of the oxide film etched by the etching apparatus 12 and outputs a measurement result to the film thickness measurement instruction unit 15c.

When the measurement result is input, the film thickness measurement instruction unit 15c outputs the correction values of the respective constants in the expression (5) and the expression (6) to the predicted film thickness calculation unit 15a and to the correction amount calculation unit 15b so that a next etching time does not depart from the predetermined etching conditions. Then, the predicted film thickness calculation unit 15a and the correction amount calculation unit 15b update the respective constants in the expression (5) and the expression (6) to the correction values input from the film thickness measurement instruction unit 15c.

Figure 16:
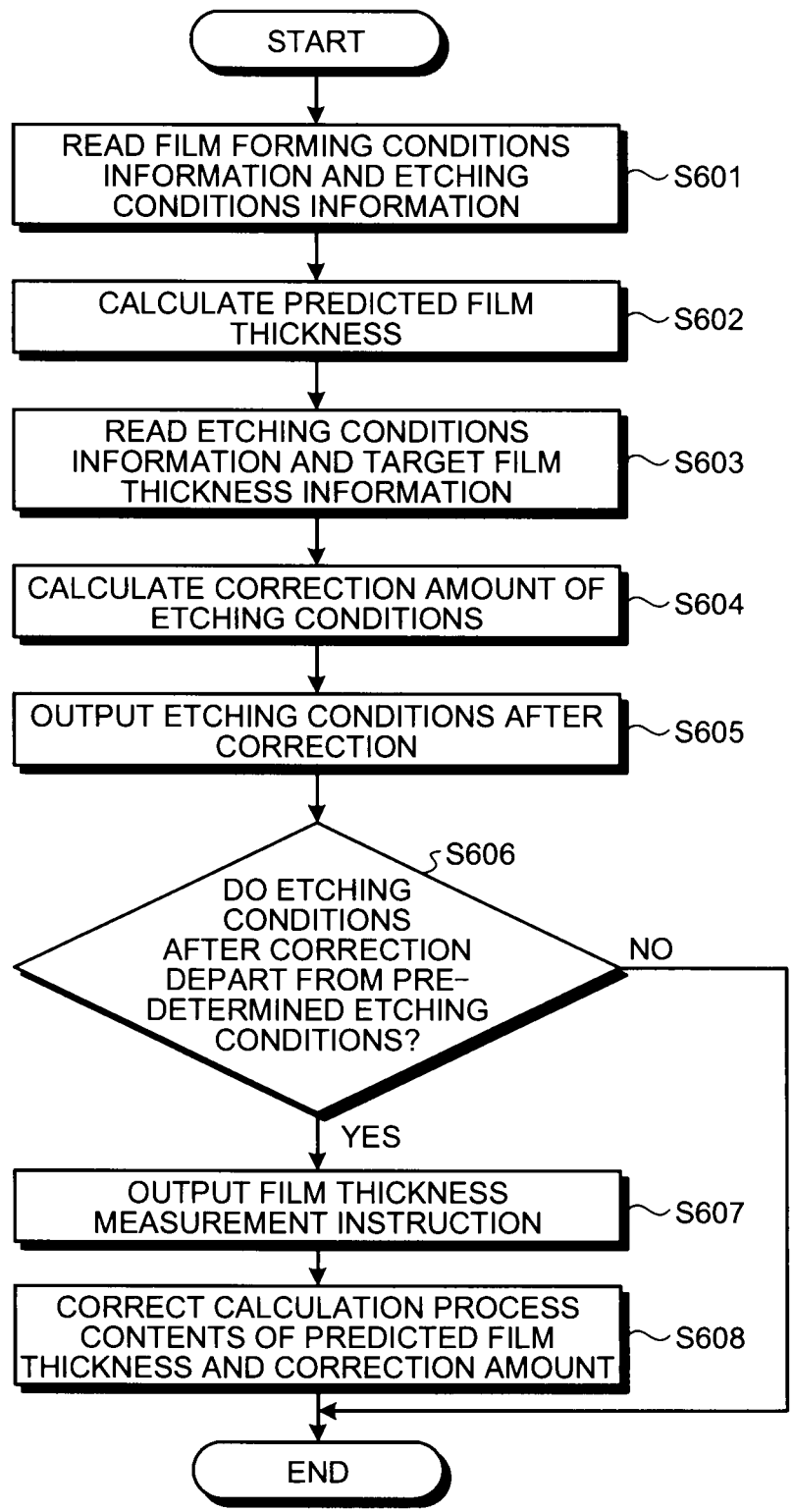
FIG. 16 is a flowchart illustrating a process executed by an adjusting apparatus according to the second embodiment.

Next the process executed by the adjusting apparatus 14 will be explained referring to FIG. 16. FIG. 16 is a flowchart illustrating a process executed by the adjusting apparatus 14 according to the second embodiment. As illustrated in FIG. 16, when the film forming conditions information 16a and the etching conditions information 16b are stored in the storage unit 16, the predicted film thickness calculation unit 15a of the adjusting apparatus 14 reads the film forming conditions information 16a and the etching conditions information 16b from the storage unit 16 (step S601).

Subsequently, the predicted film thickness calculation unit 15a executes the arithmetic process of the expression (5) using the film forming conditions information 16a and the etching conditions information 16b read from the storage unit 16 and calculates the predicted film thickness of the oxide film after the etching step (step S602). Then, the predicted film thickness calculation unit 15a outputs the calculated predicted film thickness to the correction amount calculation unit 15b.

When the predicted film thickness is input from the predicted film thickness calculation unit 15a, the correction amount calculation unit 15b reads the etching conditions information 16b and target film thickness information 16c from the storage unit 16 (step S603). Subsequently, the correction amount calculation unit 15b executes the arithmetic processes of the expression (6) and the expression (7) using the etching conditions information 16b and the target film thickness information 16c read from the storage unit 16 and calculates the correction amount of the etching conditions (here, the correction amount of the etching time) (step S604).

Then, the correction amount calculation unit 15b corrects the etching conditions (here, the etching time) of the etching apparatus 12 using the calculated correction amount and outputs the etching conditions after correction to the etching apparatus 12 and the film thickness measurement instruction unit 15c (step S605).

Subsequently, the film thickness measurement instruction unit 15c determines whether or not the etching conditions after correction input from the correction amount calculation unit 15b departs from the predetermined etching conditions (step S606). Here, when the film thickness measurement instruction unit 15c determines that the etching conditions after correction does not depart from the predetermined etching conditions (step S606, No), the film thickness measurement instruction unit 15c finishes the process.

In contrast, when the film thickness measurement instruction unit 15c determines that the etching conditions after correction departs from the predetermined etching conditions (step S606, Yes), the film thickness measurement instruction unit 15c outputs the film thickness measurement instruction to the film thickness measurement apparatus 13 (step S607).

Subsequently, the film thickness measurement instruction unit 15c corrects the contents of the calculation process of the correction amounts of the predicted film thickness and the etching conditions based on the film thickness of the oxide film after the film forming step and the measurement result of the film thickness of the oxide film after the etching step input from the film thickness measurement apparatus 13 (step S608).

For example, the film thickness measurement instruction unit 15c finishes the process by outputting the correction values of the respective constants in the expression (5) and the expression (6) to the predicted film thickness calculation unit 15a and to the correction amount calculation unit 15b so that a next etching time does not depart from the predetermined etching conditions.

As described above the manufacturing method of the semiconductor device according to the second embodiment includes the film forming step for forming a thin film of semiconductor on a substrate and the etching step for etching the formed thin film and reducing the film thickness of the thin film. Further, the manufacturing method of the semiconductor device according to the second embodiment includes an adjustment step for adjusting the etching conditions in the etching step based on the film forming conditions of the thin film in the film forming step and the etching conditions in the etching step.

With the configuration, according to the manufacturing method of the semiconductor device according to the second embodiment, since the effect of adjustment of the etching conditions is reflected from the thin film etched this time, the yield of a product can be improved.

Further, in the adjustment step in the manufacturing method of the semiconductor device according to the second embodiment, the film thickness of the thin film after the etching step is predicted based on the film forming conditions set to the film forming apparatus 11 and the etching conditions set to the etching apparatus 12. Further, in the adjustment step, the etching conditions are adjusted so that the difference between the predicted film thickness after the etching step and the predetermined target film thickness of the thin film is reduced.

That is, in the manufacturing method of the semiconductor device according to the second embodiment, the adjustment of the etching conditions can be executed without executing the measurement the film thickness of the thin film after the film forming step and the measurement of the film thickness of the thin film after the etching step.

With the operation, according to the manufacturing method of the semiconductor device according to the second embodiment, since the number of times of measurement of the film thickness by the film thickness measurement apparatus 13 can be reduced and a film thickness measurement time can be shortened, the manufacture time of the product can be reduced.

Further, in the manufacturing method of the semiconductor device according to the second embodiment further includes a measurement step for measuring the film thickness of the thin film when the etching conditions adjusted by the adjustment step depart from the predetermined etching conditions.

With the configuration, in the manufacturing method of the semiconductor device according to the second embodiment, when the etching conditions after adjustment depart from the predetermined etching conditions, the contents of the calculation process of the correction amounts of the predicted film thickness and the etching conditions can be corrected using the measurement result when an actual film thickness was measured. Accordingly, in the manufacturing method of the semiconductor device according to the second embodiment, the film thickness of the thin film after etching can be more accurately approached to the desired target film thickness.

Note that, in the second embodiment, although the case that the film forming apparatus 11 is the apparatus for forming a silicon oxide film has been explained, the film forming apparatus 11 may be an apparatus for forming the thin film of an optional semiconductor such as a silicon nitride film, a silicon film by an epitaxial growth, and the like.

Further, in the second embodiment, although the case that the etching time in the etching conditions is adjusted has been explained, the etching condition to be adjusted may be the number of times of the etching process per a predetermined time and the adjustment of the process temperature in the etching step.

Further, in the second embodiment, although the case that the etching apparatus 12 is the apparatus for executing the wet etching has been explained, the etching apparatus 12 may be an apparatus for executing a dry etching. Further, a polishing apparatus for reducing the film thickness to the desired film thickness by polishing the thin film may be used in place of the etching apparatus 12. In that case, polish conditions set to the polishing apparatus is adjusted based on the film forming conditions and the polish conditions set to the polishing apparatus. Note that when polishing apparatus is an apparatus for executing CMP (Chemical Mechanical Polishing), the polish conditions are a polishing time, the roughness of a polishing agent, and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device comprising:
    forming a semiconductor thin film on a substrate;
    processing the thin film to a predetermined shape;
    executing an ion implantation process on the thin film processed to the predetermined shape;
    executing an anneal treatment on the thin film on which the ion implantation process has been executed to create a resistor element;
    calculating a predicted value of a sheet resistance of the resistor element; and
    adjusting one or both of a dose amount of ions in the ion implantation process and a treatment temperature in the anneal treatment, wherein
    the calculating includes one or both of: calculating the predicted value based on a film thickness of the thin film formed in the forming and a film-thickness/resistance function, which shows a relation between a film thickness of the thin film and the sheet resistance; and calculating the predicted value based on a size of the thin film processed in the processing and a size/resistance function, which shows a relation between a size of the thin film and the sheet resistance, and
    the adjusting includes one or both of: adjusting the dose amount based on a dose-amount/resistance function, which shows a correspondence relation between the dose amount and the sheet resistance, to reduce a difference between an object value and the predicted value of the sheet resistance; and adjusting the treatment temperature based on a treatment-temperature/resistance function, which shows a correspondence relation between the treatment temperature and the sheet resistance, to reduce a difference between an object value and the predicted value of the sheet resistance.

2. The manufacturing method of a semiconductor device according to claim 1, wherein when the treatment temperature is adjusted, the adjusting further includes adjusting the treatment temperature to each position in the substrate of the thin film processed to the predetermined shape.

3. The manufacturing method of a semiconductor device according to claim 1, wherein the size of the thin film is a length and a width on the substrate of the thin film processed in the processing.

4. The manufacturing method of a semiconductor device according to claim 1, wherein the calculating further includes calculating the predicted value of the sheet resistance at each position of the substrate in a film forming furnace in which the forming is executed.

* * * * *